United States Patent
Peichl et al.

(10) Patent No.: US 6,972,469 B2
(45) Date of Patent: Dec. 6, 2005

(54) LATERAL PIN DIODE AND METHOD FOR PROCESSING SAME

(75) Inventors: Raimund Peichl, Hoehenkirchen-Siegertsbrunn (DE); Philipp Seng, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/730,636

(22) Filed: Dec. 8, 2003

(65) Prior Publication Data

US 2004/0119130 A1    Jun. 24, 2004

Related U.S. Application Data

(63) Continuation of application No. PCT/EP02/06018, filed on May 31, 2002.

(30) Foreign Application Priority Data

Jun. 8, 2001    (DE) ................................ 101 27 952

(51) Int. Cl.$^7$ ........................................... H01L 31/058
(52) U.S. Cl. ...................... 257/458; 257/459; 257/460; 257/465; 257/466; 438/48; 438/89; 438/98
(58) Field of Search ................................. 257/458–466; 438/48, 89, 98

(56) References Cited

U.S. PATENT DOCUMENTS

| | | | |
|---|---|---|---|
| 4,571,559 A | 2/1986 | Henry et al. ............... 333/17 L |
| 5,102,822 A * | 4/1992 | Calligaro ..................... 438/429 |
| 5,343,067 A | 8/1994 | Nakagawa et al. .......... 257/487 |
| 5,767,548 A | 6/1998 | Wondrak et al. ............. 257/347 |
| 6,667,528 B2 * | 12/2003 | Cohen et al. ................. 257/469 |

FOREIGN PATENT DOCUMENTS

| | | | | |
|---|---|---|---|---|
| FR | 2 632 776 A1 | 6/1988 | ........... H01L 29/90 |
| JP | 57128983 | 10/1982 | ........... H01L 29/91 |
| JP | 58134479 | 10/1983 | ........... H01L 29/91 |
| WO | WO99/59208 | 11/1999 | .......... H01L 29/739 |
| WO | WO01/71819 A2 | 9/2001 | .......... H01L 29/868 |

OTHER PUBLICATIONS

Sridhar S., et al.; "Dielectrically Isolated Lateral High Voltage PIN Rectifiers for Power ICs"; Technical Digest, International San Francisco, CA; pps. 245-248, Dec. 1992.

* cited by examiner

*Primary Examiner*—Donghee Kang
(74) *Attorney, Agent, or Firm*—Baker Botts L.L.P.

(57) ABSTRACT

A PIN diode includes a first p-area, an n-area, and in between an intermediate area on a first surface of a substrate, wherein a doping concentration of the intermediate area is lower than a doping concentration of the p-area and lower than a doping concentration of the n-area. Further, the PIN diode includes a first electrically conductive member, which is arranged on a side of the p-area, which faces away from the intermediate area, and a second electrically conductive member, which is arranged on a side of the n-area, which faces away from the intermediate area. The PIN diode is preferably separated from the substrate by an insulating layer, covered by a further insulating layer on the surface, which faces away from the substrate, and laterally surrounded by a trench filled with an insulating material, such that it is essentially fully insulated and encapsulated.

19 Claims, 8 Drawing Sheets

LATERAL PIN DIODE AND METHOD FOR PROCESSING SAME

CROSS REFERENCE TO RELATED APPLICATION

This application is a continuation of copending International Application No. PCT/EP02/06018 filed May 31, 2002, and claiming a priority date of Jun. 8, 2001, which designates the United States.

TECHNICAL FIELD OF THE INVENTION

The present invention relates to a PIN diode and a method for processing the same and, in particular, to a PIN diode having a lateral current flow direction.

DESCRIPTION OF THE RELATED ART

PIN diodes are semiconductor diodes which comprise an intermediate area between a p-doped p-area and an n-doped n-area, which is much less doped than the p-area and the n-area and which is also referred to as an intrinsic area or i-area. Amongst other things, a large number of PIN diodes are used in high-frequency circuits, where they are used in various functions, amongst other things, as passive-type high-frequency diodes at frequencies up to 50 GHz and above. For many applications, a PIN diode having a "long" i-area is desirable or required.

Conventionally, pin diodes are vertically structured, i.e. a p-doped semiconductor layer, a lightly-doped semiconductor layer, and an n-doped semiconductor layer, thus being a p-area, an i-area, and an n-area, respectively, are grown in successive order onto a substrate or a wafer, using the just mentioned or the opposite order. The so-called length of the i-area corresponds to the thickness of the lightly-doped semiconductor layer. Although in this way an i-area of any conceivable length can be manufactured by growing a correspondingly thick, lightly doped semiconductor layer, this may result in technical problems in practice. On the one hand, it is often desirable that the contacts or pads both for the anode and the cathode are arranged on one and the same side of the device, for example on the surface of the layer structure grown onto the substrate. This means that an electrical connection has to be made to the top side of the layer structure, starting from the bottom side of the layer structure across the total height of the device. In particular, with a long i-area (more than 30 $\mu$m) or a correspondingly thick, lightly-doped semiconductor layer, this problem is very complex to solve. On the other hand, problems may also arise with long i-areas when dicing diodes manufactured on a substrate and/or when insulating the PIN diode of laterally adjacent semiconductor structures on the same substrate. A dicing operation by sawing the substrate with the grown layer structure of the PIN diode generates rough surfaces or sawn edges, which have a negative effect on the edge re-combination properties of the PIN diode. A lateral separation and/or insulation of a PIN diode of adjacent devices by etching a trench, which is considerably more advantageous as regards the edge re-combination properties, is nowadays technologically limited to a trench depth and/or a thickness of the semiconductor layer structure of approximately 30 $\mu$m. Thus, manufacturing PIN diodes having especially long i-areas (>30 $\mu$m) is complicated and expensive to manufacture and requires compromises concerning the edge re-combination properties.

SUMMARY OF THE INVENTION

The object of the present invention is to provide a PIN diode having a long i-area and a method for manufacturing the same.

The present invention is based on the idea of arranging a PIN diode horizontally, i.e. in parallel to a wafer surface, in order to obtain a long i-area, independent of the thickness of a lightly-doped semiconductor layer which serves for forming an i-area. A combination of the trench technology and the technology of wafer-bonding enables the manufacturing of PIN diodes having a horizontal P-I-N structure. The trench technology creates high-quality passivated oxide interfaces which produce a low re-combination rate. The horizontal arrangement of the P-I-N structure enables additional degrees of freedom as regards the choice of orientation and of the cross-sections of the current/signal flow. In particular, PIN diodes having long i-areas, which, so far, could only be implemented in the vertical direction by using an especially thick epitaxy (30 $\mu$m to 150 $\mu$m), are now much easier to realize and may comprise various parameters. In particular, it is now simply possible to implement the pads for the anode and the cathode on the same wafer surface or on the same side of the device, respectively. This makes it possible to design the PIN diode as a flip chip, for example. Using the technology of direct wafer bonding makes it further possible to implement a PIN diode which is completely encapsulated in oxide.

As a starting material for a PIN diode in accordance with the present invention, a direct bonded wafer may be used, which already comprises an insulating oxide layer between the handling or carrier wafer, which, in the following, is often only referred to as a substrate, and the device or device wafer, which, in the following, is referred to as a device substrate. This insulating oxide layer forms an interface of the later i-area of the PIN diode. In parallel to the direction of the later current flow, trenches are etched into the device substrate, which reach from the exposed surface of the device substrate to the insulating oxide layer between the device substrate and the substrate. Similarly, trenches are etched vertically to the current direction. Thus, the area of the later PIN diode is laterally insulated from the remaining device substrate by means of oxide layers. By means of the lateral design and extension of the trenches which, in essence, is only limited by the lateral expansion of the device substrate, the designer is given carte blanche when designing shape and cross-sections of the PIN diode and its individual p-, n- and i-areas. Thus, it is particularly easy to provide a very long i-area, which, in the following, is often referred to as an intermediate area. The length of the i-area or intermediate area, respectively, especially depends on the depth of the trenches.

For manufacturing the p-area and the n-area of the lateral PIN diode, etched trenches may also be used, which are filled with highly conductive p+ or n+ poly silicon, respectively. Alternatively, a suitable doping of the semiconductor for manufacturing the p-area and the n-area may be effected by means of a steep implant of the corresponding p-material or n-material, respectively, into the areas of the device substrates which are predetermined for the p-area or the n-area, respectively. A further alternative includes the etching of trenches, which are subsequently lined with phosphor or boron, respectively, as a doping material, wherein the doping materials are subsequently diffused into the areas of the device substrate surrounding the trenches. If the insulating oxide layer between the device substrate and the substrate under the p-area or the n-area is etched, a contact with the substrate can be made, whereby contacting of the p-area or of the n-area via the rear side of the substrate is enabled. A layer having increased conductability, which is e.g. made of metal silicide or tungsten and which ranges from the surface of the device substrate into the depth, may be provided in or behind the p-area or the n-area. Thus, a voltage drop within the p-area or the n-area, respectively, is reduced, when current flows through the PIN diode, and a more homogeneous current distribution within the PIN diode is enabled. Finally, the structure is covered by an oxide nitride sandwich passivation. By choosing a suitable geometry of the diode area, various electrical parameters may be optimized. For example, a PIN diode with especially good IP3 properties and an especially good forward resistance Rf may be implemented using a concentric geometry or geometry of a piece of cake (small n-area and large p-area).

In accordance with a first aspect of the present invention, this object is achieved by a method for manufacturing a PIN diode including a step of forming a p-area on a first surface of a substrate, a step of forming an n-area on the first surface of the substrate, which is spaced apart from the p-area, a step of forming an intermediate area on the first surface of the substrate between the n-area and the p-area, wherein a doping concentration of the intermediate area is less than a doping concentration of the p-area and less than a doping concentration of the n-area, a step of forming a first electrically conductive member on a side of the p-area, which faces away from the intermediate area, and a step of forming a second electrically conductive member on a side of the n-area, which faces away from the intermediate area. Preferably, the method further includes a step of providing the substrate and a device substrate and a step of wafer-bonding of the substrate and device substrate, wherein the p-area, the n-area and the intermediate areas are formed in the device substrate and insulated against the substrate. Further, a trench is preferably formed in a section of the device substrate, which is adjacent to the intermediate area and which extends from a surface of the device substrate facing away from the substrate to a surface of the device substrate being opposite to the substrate and which may be further arranged in sections of the device substrate which are adjacent to the p-area and to the n-area. The trench may be filled with an insulating material and further it preferably abuts immediately to the intermediate area and/or the p-area and the n-area. The method may further include a step of forming an insulating layer above the p-area, the n-area, and the intermediate area, such that a lateral PIN diode, which is completely encapsulated in oxide, is created, provided the trench is designed accordingly.

In accordance with a second aspect of the present invention, this object is also achieved by a PIN diode including a p-area on a first surface of a substrate, an n-area on the first surface of the substrate, and an intermediate area on the first surface of the substrate between the n-area and the p-area, wherein a doping concentration of the intermediate area is less than a doping concentration of the p-area and less than a doping concentration of the n-area. The PIN diode further includes a first electrically conductive member, which is arranged on a side of the p-area, which faces away from the intermediate area, and a second electrically conductive member, which is arranged on a side of the n-area, which faces away from the intermediate area. The substrate may comprise an insulating layer on its first surface, on which a device substrate is arranged, wherein the p-area, the n-area, and the intermediate area are arranged in the device substrate. A trench in a section of the device substrate, which abuts to the intermediate area, which extends from a surface of the device substrate, which faces away from the substrate, to a surface of the device substrate, which is opposite to the substrate, and which may be filled with an insulating material, may insulate the intermediate area and, if it is further arranged in sections of the device substrate, which abut to the p-area and the n-area, the p-area and the n-area against other areas of the device substrate. The PIN diode may further comprise an insulating layer, which covers the surfaces of the n-area, the p-area, and the intermediate area, which face away from the substrate. Laterally, the intermediate area may comprise the shape of a rectangle, trapezoid, circle or any other shape, wherein the p-area and the n-area may be arranged on two opposite sides of the rectangle or of the trapezoid. Both the p-area and the n-area may each extend across a whole side or some part of a side. Furthermore, the lateral shape of the intermediate area may be that of a circle, wherein the p-area or the n-area extends along the edge of the intermediate area as in a circle, wherein the n-area or the p-area, respectively, is essentially arranged in the center of the intermediate area and the second electrically conductive member or the first electrically conductive member, respectively, is arranged in its center.

One advantage of the inventive PIN diode or the inventive method for manufacturing a PIN diode is the possibility of a long intermediate area or long i-area, respectively. By the lateral arrangement of p-area, i-area or intermediate area, and n-area, the length of the i-area in the current direction is independent of the thickness of the lightly-doped semiconductor layer, which forms the intermediate area, and may be easily extended in almost any manner whatsoever. A further aspect includes the installation height of the inventive PIN diode, which is reduced as a result thereof and which no longer stands in any relation to the length of the intermediate area. Since, with the inventive PIN diode, the intermediate area, independent of its length in the current direction, is laterally fully surrounded by oxide layers, the charge carrier recombination properties of the inventive PIN diode have been clearly improved, e.g. as against conventional PIN diodes with a long i-area, which are diced by saw surfaces, which directly abut to the i-area. Furthermore, the inventive PIN diode enables an absolutely easy arrangement of both terminals (for the p-area and the n-area) on the same side or surface, respectively, of the PIN diode. Therefore, the inventive PIN diode is especially suitable for being used within flip-chip technology.

BRIEF DESCRIPTION OF THE DRAWINGS

Preferred embodiments of the present invention are explained in detail below with reference to the attached drawings, which show:

FIG. 1b a schematic top view illustration of the PIN diode from FIG. 1a;

FIG. 4b a schematic top view illustration of the PIN diode from FIG. 4a;

FIG. 5b a schematic top view illustration of the PIN diode from FIG. 5a;

FIG. 6b a schematic top view illustration of the PIN diode from FIG. 6a;

FIG. 7b a schematic top view illustration of the PIN diode from FIG. 7a;

FIG. 8b a schematic top view illustration of the PIN diode from FIG. 8a;

FIG. 9b a schematic top view illustration of the PIN diode from FIG. 9a.

DESCRIPTION OF PREFERRED EMBODIMENTS

Figure 1A:
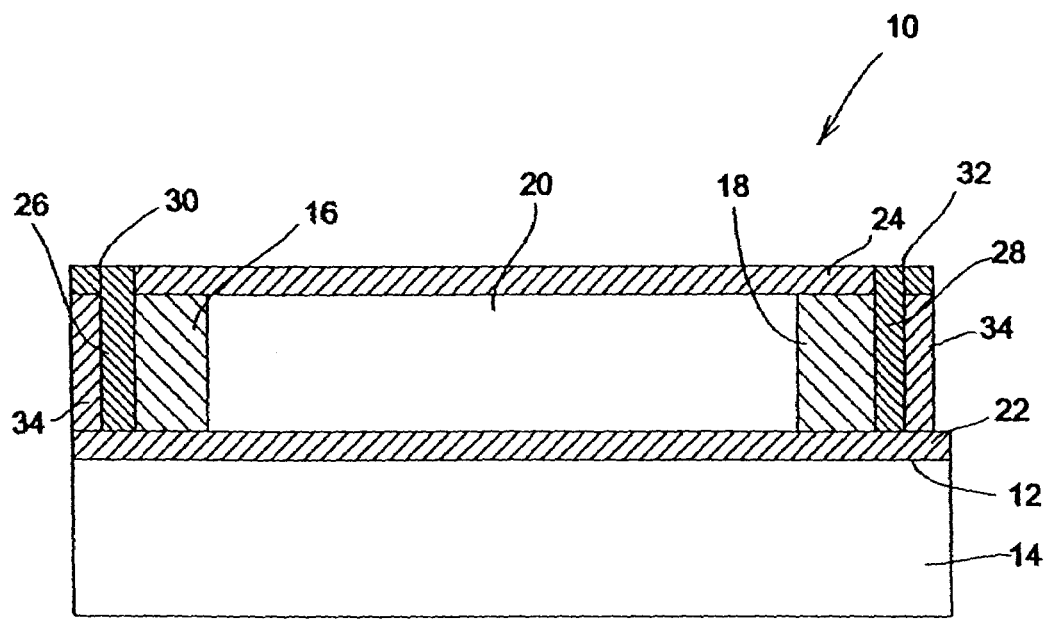
FIG. 1a a schematic illustration of a PIN diode in accordance with a first embodiment of the present invention.
Figure 1B:
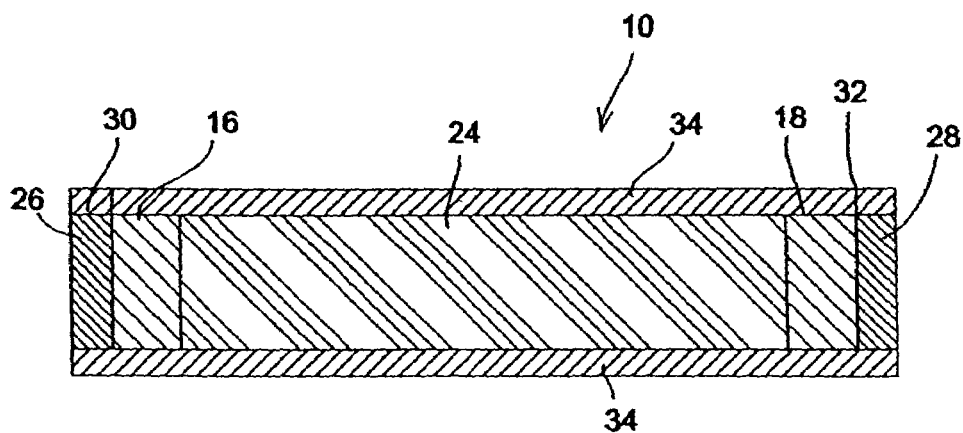

FIG. 1a shows a schematic illustration of a PIN diode 10 in accordance with a first preferred embodiment of the present invention in a vertical sectional view, i.e. in a view of a section along a level, vertical to a first surface 12 of a substrate 14, on which the PIN diode 10 is formed. FIG. 1b shows a schematic illustration of the same PIN diode in a horizontal sectional view, i.e. in a cross-section along a level, parallel to the first surface 12 of the substrate 14. The PIN diode 10 comprises a p-area 16, an n-area 18, and an intermediate area or i-area 20, respectively. Between the substrate 14, on the one hand, and the p-area 16, the n-area 18, and the intermediate area 20, on the other hand, a first insulating oxide layer 22 is arranged on the first surface 12 of the substrate 14. Similarly, a second insulating oxide layer, which is essentially parallel to the first insulating oxide layer 22, is arranged on the surface of the p-area 16, the n-area 18, and the intermediate area 20, which faces away from the first surface 12 of the substrate 14. In its lateral direction (FIG. 1b), the intermediate area 20 essentially comprises the shape of a rectangle. The p-area 16 and the n-area 18 are arranged on opposite sides of this rectangle and directly abut on the intermediate area along the entire width of their respective side. In the vertical direction, i.e. in the direction vertical to the first surface 12 of the substrate 14, exactly as the intermediate area 20, they extend from the first insulating oxide layer 22 to the second insulating oxide layer 24 and, across the total height, abut directly on the intermediate area 20. On the side of the p-area 16, which faces away from the intermediate area 20, a first electrically conductive member 26 is arranged, which directly abuts on the same along the whole face of the side of the p-area, which faces away from the intermediate area 20, whereby a large-surface electrical contact is made between the p-area 16 and the first electrically conductive member 26. Likewise, a second electrically conductive member 28 is arranged on the side of the n-area 18, which faces away from the intermediate area 20, which, in turn, directly abuts on the same across the whole face of the side of the n-area 18, which faces away from the intermediate area 20, whereby a large-surface electrical contact is made between the n-area 18 and the second electrically conductive member 28. In the vertical direction, the electrically conductive members 26, 28 reach from the first insulating oxide layer 22 to the surface of the second insulating oxide layer 24, which faces away from the substrate 14, where they are laterally extended to form electrical contacts or pads 30, 32. Laterally, abutting on the p-area 16, the n-area 18, the intermediate area 20, the first electrically conductive member 26 and the second electrically conductive member 28, a surrounding trench 34 is arranged which, in the vertical direction, extends from the second insulating oxide layer 24 to the first insulating oxide layer 22. The trench 34 is filled with insulating material and, in the lateral direction, fully encloses the p-area 16, the n-area 18, the intermediate area 20, and the two electrically conductive members 26, 28, so that it insulates the same against electricity from other, laterally adjacent to semiconductor structures or devices on the first surface 12 of the substrate 14. The first insulating oxide layer 22, the second insulating oxide layer 24 and the trench 34, which is filled with an insulating material, together form a complete encapsulation of the p-area 16, the n-area 18, the intermediate area 20, the first electrically conductive member 26, and the second electrically conductive member 28, which together form the PIN diode 10.

The intermediate area 20 consists of a lightly-doped semiconductor material and forms the "intrinsic area" or i-area, respectively, of the PIN diode 10. The intermediate area 20 comprises a doping concentration which is lighter or considerably lighter than the doping concentration of the p-area 16 and the n-area 18. The p-area 16 consists of a p-doped semiconductor material, and the n-area consists of an n-doped semiconductor material. The p-area 16, the intermediate area 20, and the n-area 18 together form the actual P-I-N structure of the PIN diode 10. The first electrically conductive member 26 and the second electrically conductive member 28 consist of e.g. tungsten, metal silicide or any other material having good conductivity and, even if current flows through the PIN diode 10, they serve to minimize a voltage drop within the p-area 16 and the n-area 18, respectively, owing to the limited conductibility of the p-area 16 and the n-area 18, respectively, and, thus, to guarantee a homogeneous current distribution above the cross-section of the PIN diode 10. If the first pad 30 and the second pad 32, respectively, were conductively connected to the p-area 16 and the n-area 18, respectively without the first electrically conductive member 26 and the second electrically conductive member 28, respectively, a voltage drop from the top side of the p-area 16 and the n-area 18, respectively, which is connected to the first pad 30 and the second pad 32, respectively, to the bottom side of the p-area 16 and the n-area 18, respectively, which abuts on the first insulating oxide layer 22, would occur, when current flows through the PIN diode 10, which would result in an inhomogeneous current distribution across the cross-section of the PIN diode 10.

The intermediate area 20 of the PIN diode 10, which is illustrated in FIGS. 1a and 1b, comprises, between the p-area and the n-area, a length in the direction of the current flow which is considerably larger than the width of the intermediate area 20, which is parallel to the first surface 12 of the substrate 14 and vertical to the current flow direction, and which is furthermore considerably larger than the width of the intermediate area, which is vertical to the first surface 12 of the substrate 14 and vertical to the current flow direction. In particular, the length of the intermediate area between the p-area 16 and the n-area 18 in direction of the current flow is independent of the thickness of the intermediate area 20, i.e. of the dimension of the intermediate area vertical to the first surface 12 of the substrate 14. The length of the intermediate area 20 corresponds to the distance between the p-area 16 and the n-area 18, wherein the lateral arrangement of the same between the first insulating oxide layer 22 and the second insulating oxide layer 24 is essentially free to choose and is only limited by the lateral dimensions of the substrate 14 and by application-specific dimensional requirements to the PIN diode 10, respectively. Alternatively, the second insulating layer 24 may also be omitted.

As a deviation from the embodiment of the inventive PIN diode 10, which is shown in FIG. 1a and FIG. 1b, numerous variants and modifications are possible. It is an important feature of the present invention that it enables completely new degrees of freedom as regards the design of the intermediate area 20. FIGS. 2 to 9b represent further embodiments of the PIN diode 10 in accordance with the present invention.

Figure 2:
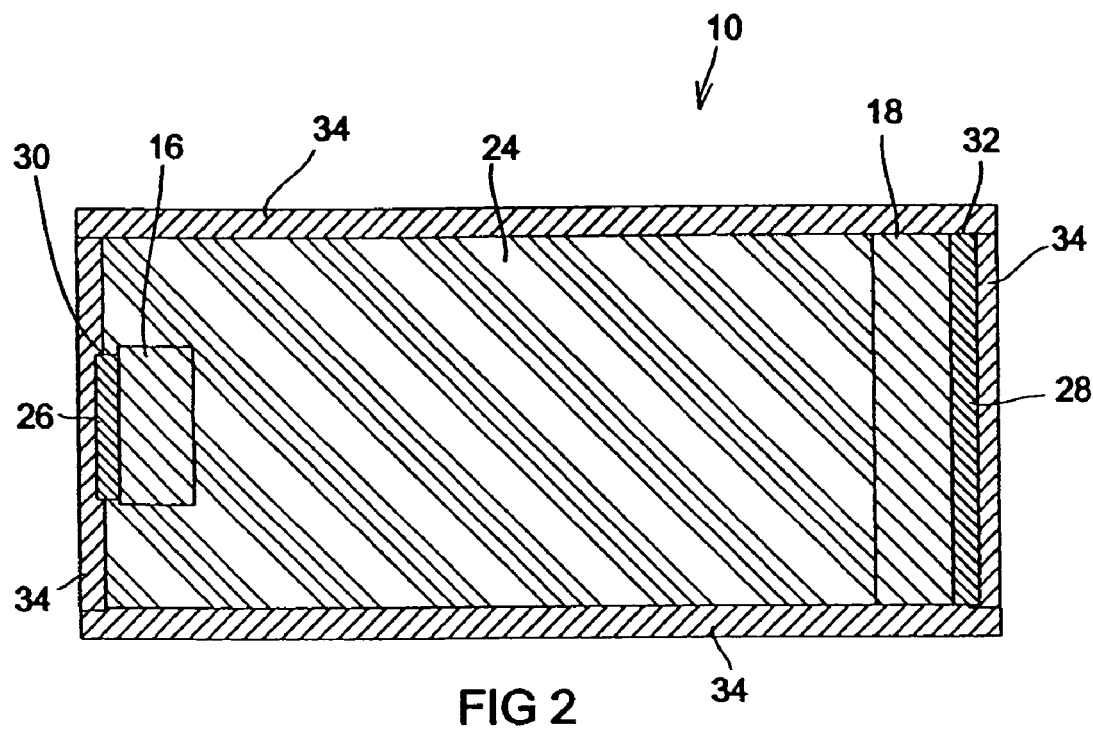
FIG. 2 a schematic top view illustration of a PIN diode in accordance with a further embodiment of the present invention.

FIG. 2 shows a schematic illustration of an embodiment of the PIN diode 10 in accordance with the present invention in a horizontal section. In this embodiment, the intermediate area 20 again comprises the shape of a rectangle in the lateral direction, which is limited by the trench 34. In contrast to the embodiment shown in FIG. 1, the intermediate area 20, however, is wider in the lateral direction, at right angles to the current direction. The n-area 18 extends along the total width of a side of the intermediate area 20. In contrast, the p-area 16, which is arranged on the opposite side of the intermediate area 20, only extends across some part of the side in the lateral direction, whereby the p-area 16, as compared to the edge of the intermediate area 20 which is defined by the trench 34, protrudes in the lateral direction. As regards all further features, the embodiment shown in FIG. 2 corresponds to the first embodiment shown in FIG. 1a and FIG. 1b.

Figure 3:
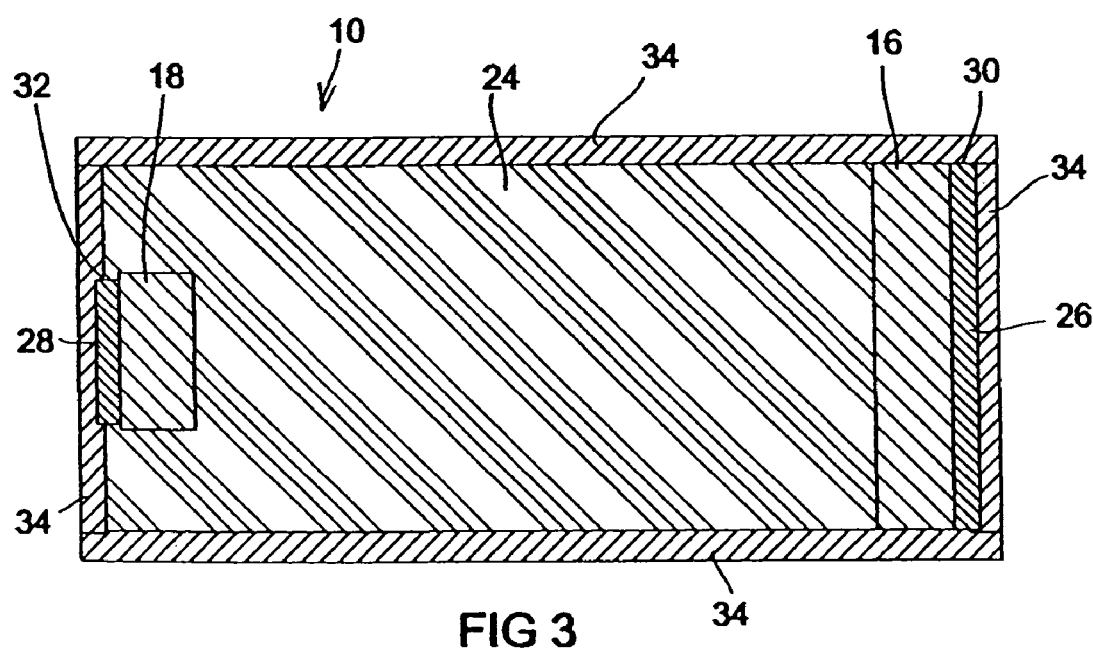
FIG. 3 a schematic top view illustration of a PIN diode in accordance with the present invention.

FIG. 3 shows a schematic illustration of a PIN diode 10 in accordance with a further embodiment of the present invention. This embodiment differs from the embodiment shown in FIG. 2 in that the p-area 16 and the n-area 18 have been exchanged, i.e. that, in the lateral direction, only the p-area 16 occupies the total width of the rectangle formed by the intermediate area 20 and in that the n-area 18 only occupies some part of the width of the opposite side of the rectangle and, as compared to the edge defined by the trench 34, protrudes on this side. As regards all further features, the embodiment shown in FIG. 3 confirms with the first two embodiments.

Figure 4A:
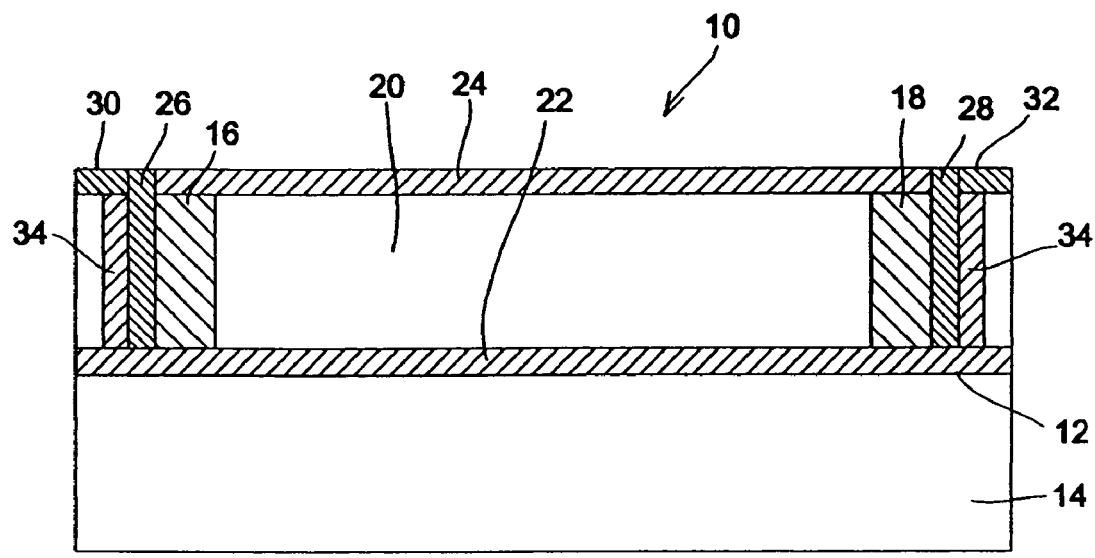
FIG. 4a a schematic illustration of a PIN diode in accordance with a further embodiment of the present invention in vertical cross-section.
Figure 4B:
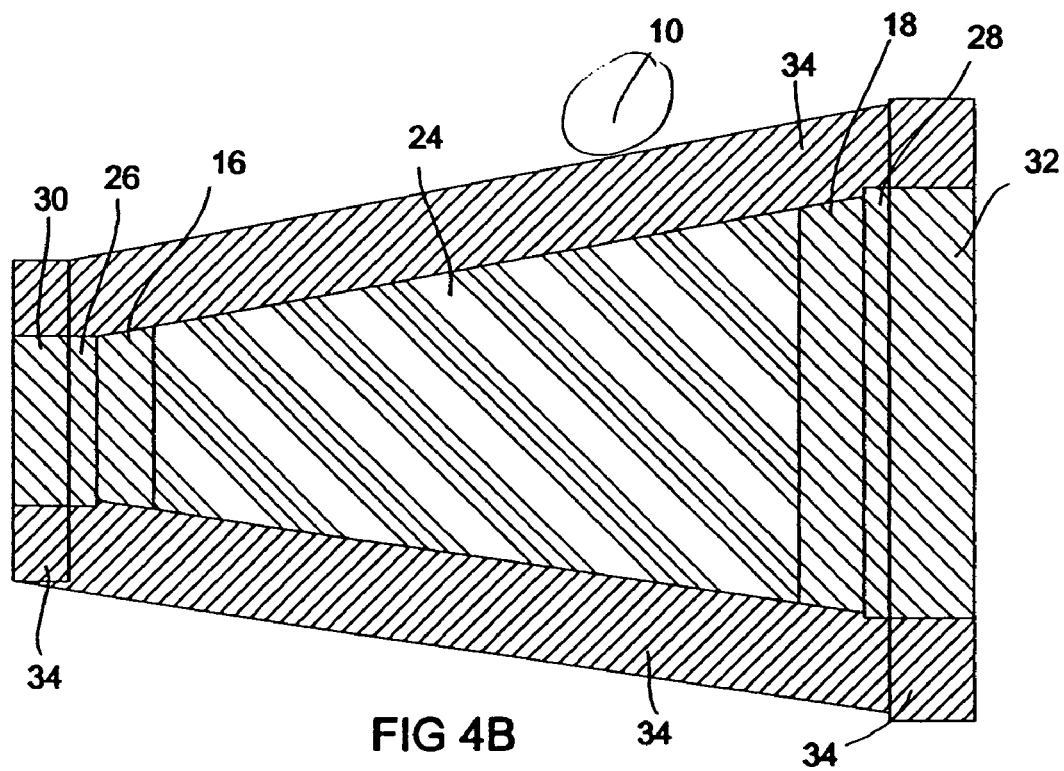

FIGS. 4a and 4b shows schematic illustrations of a further embodiment of a PIN diode 10 in accordance with the present invention. As can be seen in FIG. 4b, the intermediate area 20 comprises, in its lateral direction, the shape of a trapezoid, wherein the p-area 16 and the n-area 18 are arranged on the two opposite parallel sides of the trapezoid. Both the p-area 16 and the n-area 18 extend along the total width of the respective sides. In the vertical section shown in FIG. 4a and regarding all further features, the embodiment confirms with the preceding embodiments.

Figure 5A:
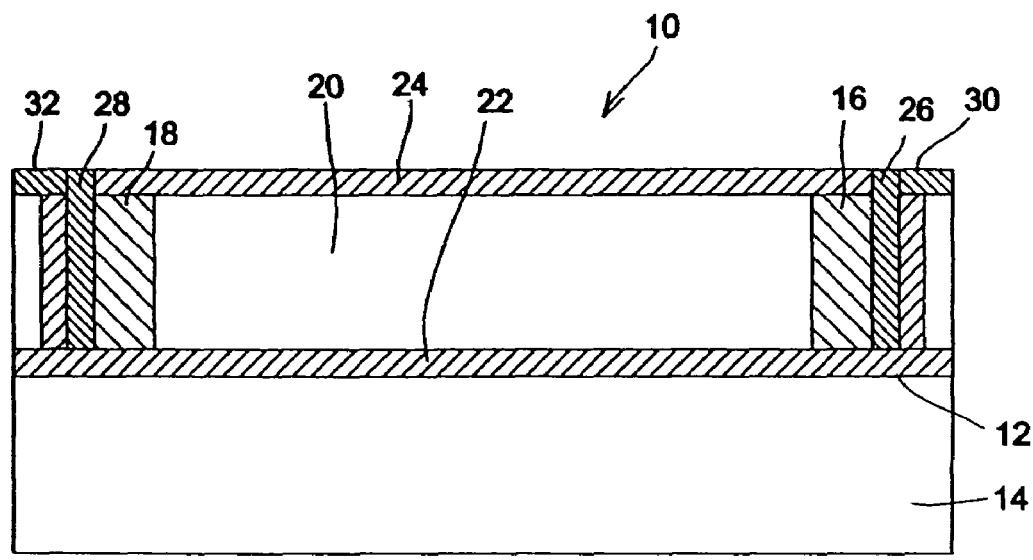
FIG. 5a a schematic illustration of a PIN diode in accordance with a further embodiment of the present invention in vertical cross-section.
Figure 5B:
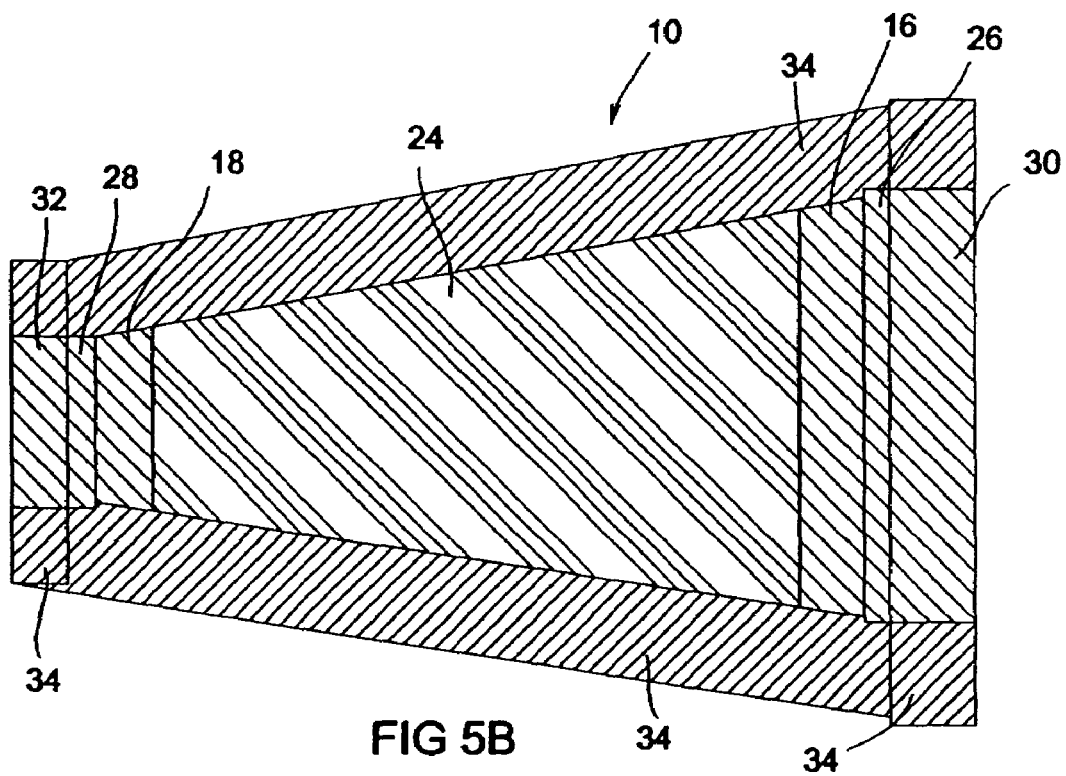

FIGS. 5a and 5b show another schematic embodiment of the PIN diode 10 according to the present invention in the vertical section or in the horizontal section. The embodiment differs from the preceding embodiment only in that the p-area 16 and the n-area 18 have been exchanged, so that the p-area 16 is arranged on the long parallel side of the trapezoid and the n-area 18 is arranged on the short side of the trapezoid. As regards all further features, the embodiment confirms with the preceding embodiment shown in FIGS. 4a and 4b.

Figure 6A:
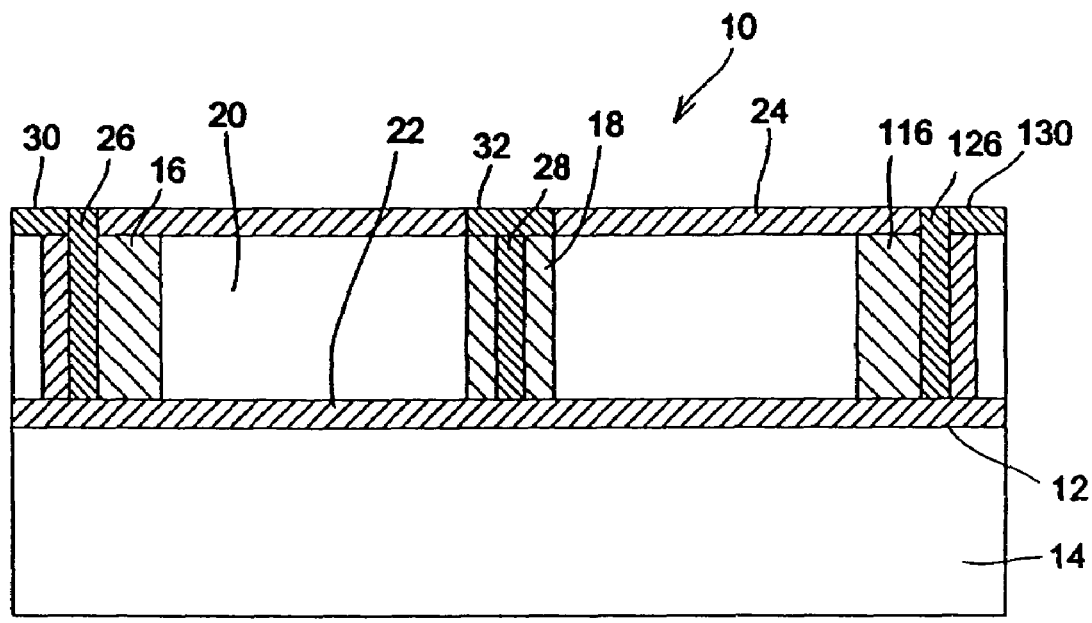
FIG. 6a a schematic illustration of a PIN diode in accordance with a further embodiment of the present invention in vertical cross-section.
Figure 6B:
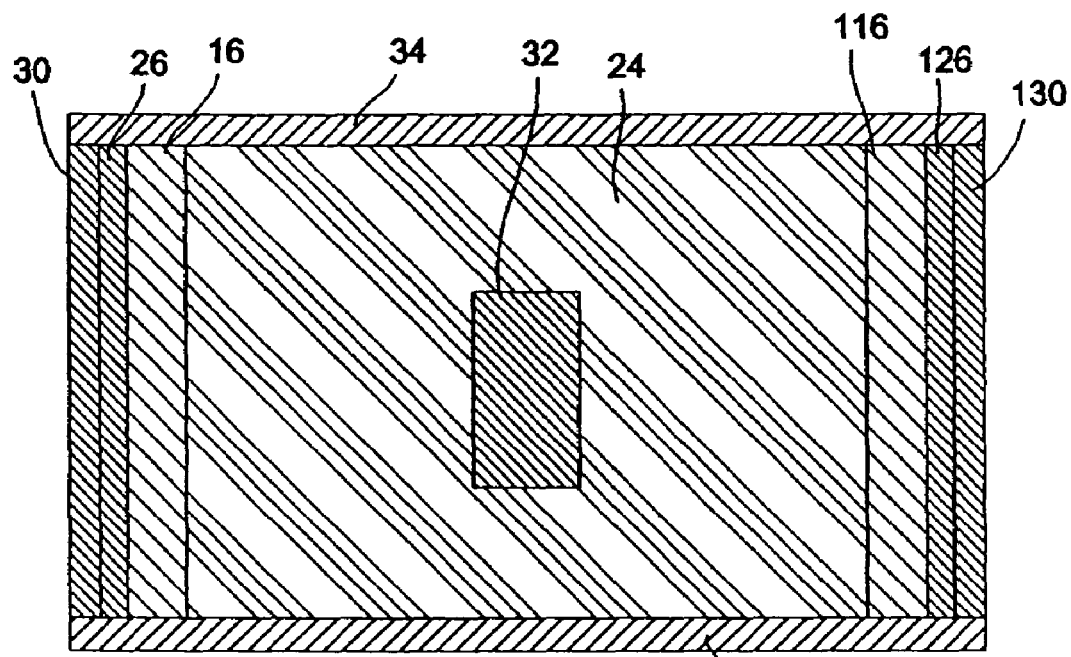

FIGS. 6a and 6b show a further schematic embodiment of the PIN diode 10 according to the present invention in the vertical section or in the horizontal section. In the lateral direction, the intermediate area 20 comprises the form of a rectangle. The p-area 16 is arranged on one side of the rectangle and extends in, the lateral direction, across the total width of the same. On the opposite side of the rectangle, a further p-area 116 is arranged, which extends across the total width of this side. As in the preceding embodiments, on the side of the p-area 16, which faces away from the intermediate area, the first electrically conductive member 26 is arranged, which stands in contact with the same across the total face of the side of the p-area 16, which faces away from the intermediate area 20. On the end of the first electrically conductive member 26, which abuts on the second insulating oxide layer 24, the first pad 30 is formed. Accordingly, on the side of the further p-area 116, which faces away from the intermediate area 20, a third electrically conductive member is arranged, which extends, like the first electrically conductive member 26, in a lateral direction across the total width of the further p-area 116 and in a vertical direction from the second insulating oxide layer 24 to the first insulating oxide layer 22 and which stands in electrical contact with the further p-area 116. A third pad 130 is implemented on the end of the third electrically conductive member 126, which is adjacent to the second insulating oxide layer 24. The n-area 18 is arranged in a lateral direction, essentially in the center of the intermediate area, such that it is fully surrounded by the intermediate area 20, does not abut on the trench 34, which demarcates the intermediate area 20, and is, in essence, equally spaced apart from the p-area 16 and the further p-area 116. In the lateral direction, the n-area 18 preferably comprises the shape of a rectangle, wherein the second electrically conductive member 28 is essentially arranged in the center of the n-area 18. On the end of the second electrically conductive member 28, which is adjacent to the second insulating oxide layer 24, the second pad 32 is implemented. The PIN diode 10 of the present embodiment, like the PIN diodes of the preceding embodiments, is arranged between a first insulating oxide layer and a second insulating oxide layer 24 on a first surface 12 of the substrate 14. In the lateral direction, the p-area 16, the n-area 18, the intermediate area 20, the further p-area 116, the first electrically conductive member 26, the second electrically conductive member 28 and the third electrically conductive member 126 are surrounded by a trench 34 filled with an insulating material, which insulates them against laterally-adjacent areas, semiconductor structures or devices on the first surface 12 of the substrate 14.

Figure 7A:
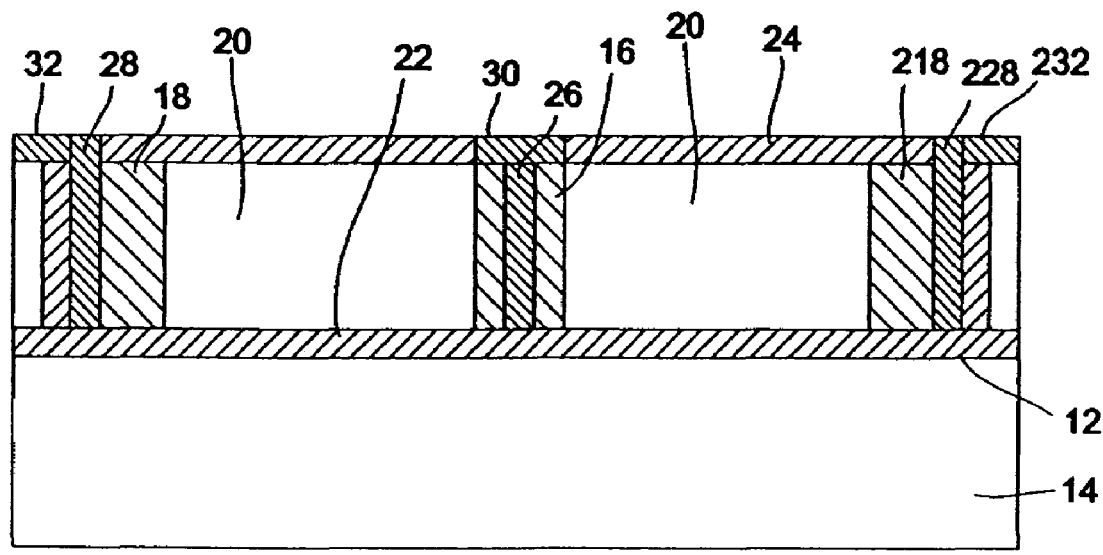
FIG. 7a a schematic illustration of a PIN diode in accordance with a further embodiment of the present invention in vertical cross-section.
Figure 7B:
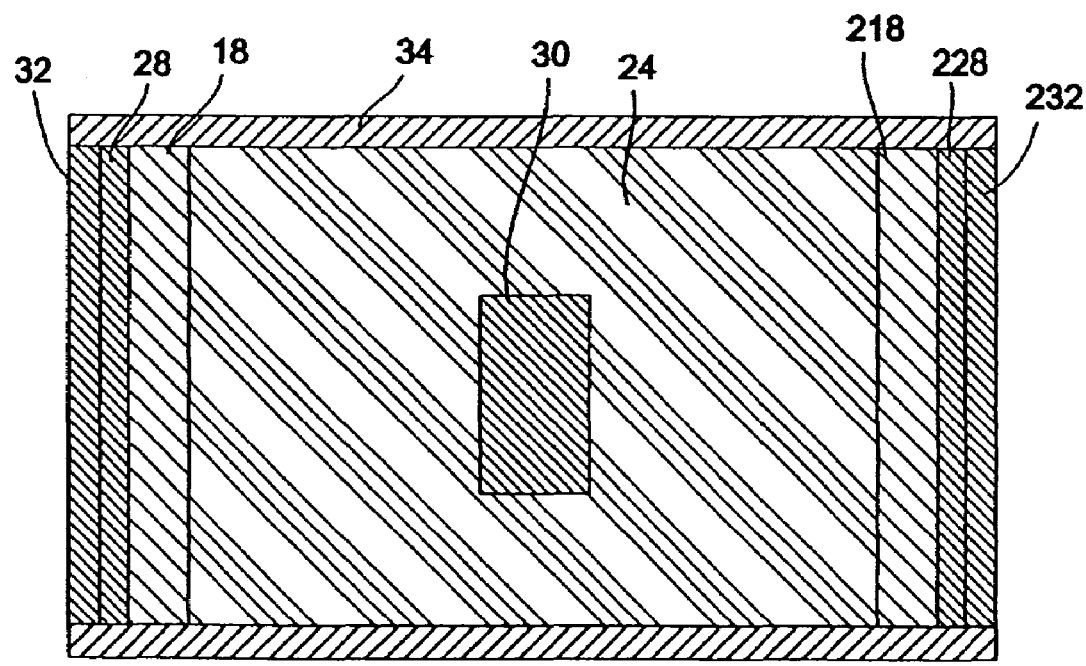

FIGS. 7a and 7b show a further schematic embodiment of the PIN diode 10 according to the present invention in the vertical section and in the horizontal section, respectively. The embodiment differs from the embodiment shown in FIGS. 6a and 6b in that the p-area 16 and the n-area 18 have been exchanged, i.e. the p-area 16 is essentially arranged in the center of the intermediate area 20, and the n-area 18 is arranged on a side of the intermediate area 20, which comprises a rectangular shape in the lateral direction, and extends across the total width of this side. Furthermore, the embodiment distinguishes itself by having a further n-area 218, instead of a further p-area 116, arranged on the side of the intermediate area 20, which is opposite to the n-area 18,. On the side of the further n-area 218, which faces away from the intermediate area 20, a third electrically conductive member 228 is arranged, which extends in the lateral direction across the total width of the further n-area 218 and in the vertical direction from the second insulating oxide layer 24 to the first insulating oxide layer 22 and which stands in electrical contact with the further n-area 218. On the end of the third electrically conductive member 228, which is adjacent to the second insulating oxide layer 24, a third pad 232 is implemented. As regards all further features, the embodiment accordingly confirms with the embodiment shown in FIGS. 6a and 6b.

Figure 8A:
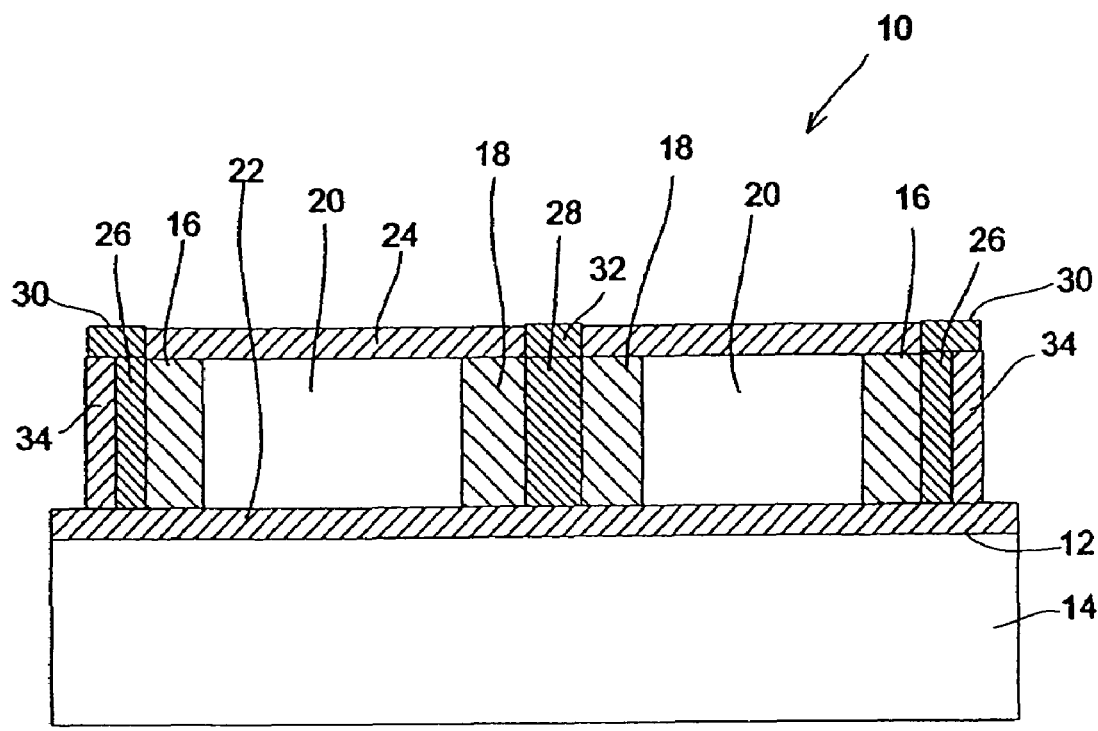
FIG. 8a a schematic illustration of a PIN diode in accordance with a further embodiment of the present invention in vertical cross-section.
Figure 8B:
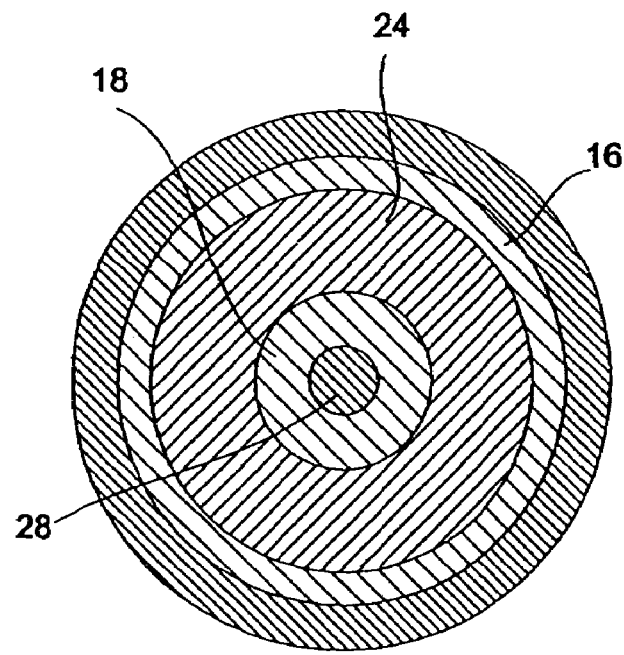

FIGS. 8a and 8b show a further schematic embodiment of the inventive PIN diode 10 in the vertical section or the horizontal section. In this embodiment, the intermediate area 20 essentially comprises the shape of a circle in the lateral direction. The p-area 16 is arranged about the intermediate area 20 in the shape of a closed annulus and, as in the preceding embodiments, it extends in the vertical direction from the second insulating oxide layer 24 to the first insulating oxide layer 22. On the side of the p-area 16, which faces away from the intermediate area 20, a first electrically conductive member 26 is arranged, which, in the lateral direction, extends along the total external perimeter of the p-area 16 and, in the vertical direction, extends from the second insulating oxide layer 24 to the first insulating oxide layer 22 and stands in contact with the p-area. On the end of the first electrically conductive member 26, which is adjacent to the second insulating oxide layer 24, a first pad 30 is implemented. In the lateral direction, essentially in the center of the intermediate area 20, an n-area 18 is arranged which, in its lateral expansion, provides an essentially circular shape and which extends in the vertical direction from the second insulating oxide layer 24 to the first insulating oxide layer 22. In the center of the n-area 18, a second electrically conductive member 28 is arranged, which also extends in the vertical direction from the second insulating oxide layer 24 to the first insulating oxide layer 22 and which, with its total perimeter and height, stands in contact with the n-area 18. On the end of the second electrically conductive member 28 which is adjacent to the second insulating oxide layer 24, a second pad 32 is implemented. The first electrically conductive member 26 is surrounded along its total perimeter by a circular trend 34 which extends in the vertical direction from the second insulating oxide layer 24 until the first insulating oxide layer 22 and is filled with insulating material. Thus, the PIN diode 10 according to the present embodiment as well as the PIN diodes according to the preceding embodiments, is, apart from the pads 30, 32 by the insulating oxide layers 22, 24 and the trench 34, which is filled with an insulating material, completely encapsulated by insulating layers.

Figure 9A:
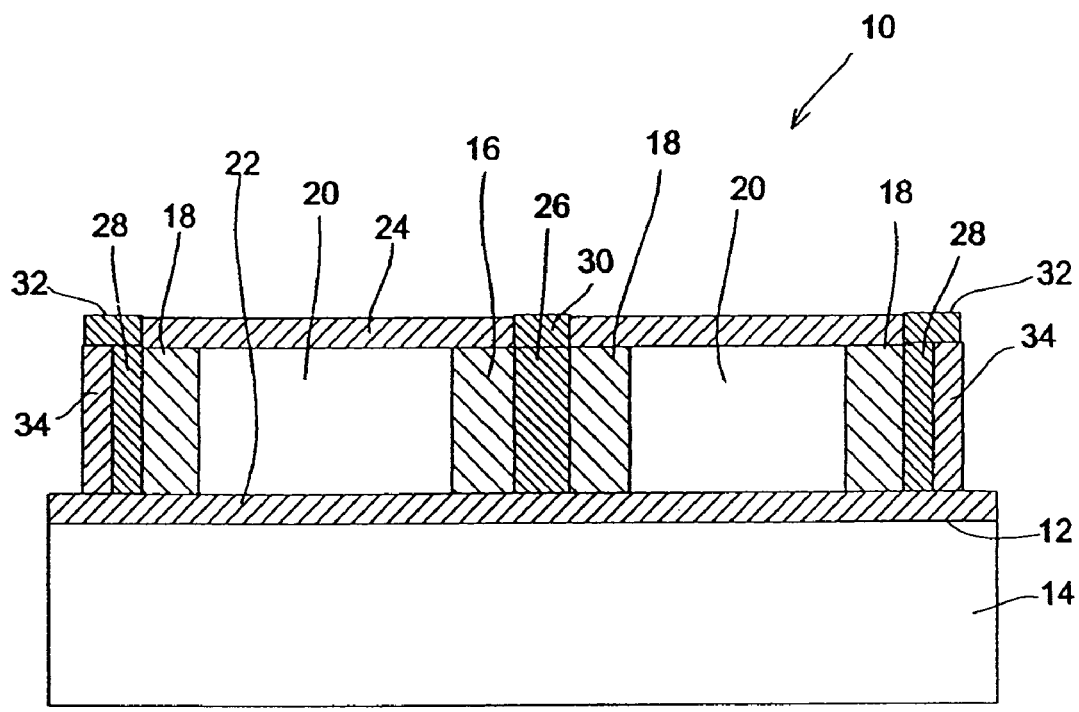
FIG. 9a a schematic illustration of a PIN diode in accordance with a further embodiment of the present invention in vertical cross-section.
Figure 9B:
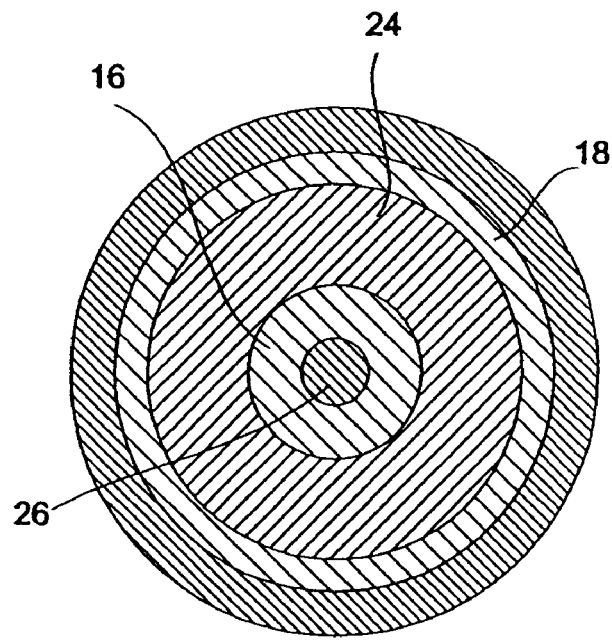

FIGS. 9a and 9b show a further schematic embodiment of the PIN diode 10 in accordance with the present invention. This embodiment differs from the preceding embodiment shown in FIGS. 8a and 8b in that the p-area 16 and the n-area 18 have been exchanged. The n-area 18 is arranged in the lateral direction on the outermost edge of the intermediate area 20, which provides an essentially circular shape, and immediately abuts on the same along the total perimeter of the intermediate area 20 and along its total vertical expansion from the second insulating oxide layer 24 to the first insulating oxide layer 22. On the side of the n-area 18, which faces away from the intermediate area 20, the second electrically conductive member 28 is arranged, which extends in the lateral direction in a circular shape along the total external perimeter of the n-area 18 and in the vertical direction from the second insulating oxide layer 24 to the first insulating oxide layer 22 and which stands in contact with the n-area 18. On the end of the second electrically conductive member 28, which is adjacent to the second insulating oxide layer 24, the second pad 32 is implemented. In the lateral direction, essentially in the center of the intermediate area 20, the p-area 16 is arranged, which extends in the vertical direction from the second insulating oxide layer 24 to the first insulating oxide layer 22. Essentially, in the center of the annular-shaped p-area 16, the first electrically conductive member 26 is arranged, which extends from the second insulating oxide layer to the first insulating oxide layer 22 and which, along its total height and perimeter, stands in contact with the p-area 16. On the end of the first electrically conductive member 26, which is adjacent to the second insulating oxide layer 24, the first pad 30 is implemented. As regards all further features, the present embodiments confirms to the embodiment shown in FIGS. 8a and 8b.

The embodiments shown in FIGS. 2a to 9b only differ from the first embodiment of the PIN diode 10 according to the present invention with respect to the lateral implementation and arrangement of the individual members. With all embodiments, the vertical structure is the same. On the surface 12 of the substrate 14, the p-area 16, the n-area 18, the intermediate area 20, the first electrically conductive member 26, and the second electrically conductive member 28 are arranged between the first insulating oxide layer 22 and the second insulating oxide layer 24. The p-area 16, the n-area 18, the intermediate area 20, the first electrically conductive member 26, and the second electrically conductive member 28 extend in the vertical direction, i.e. in the direction vertical to the surface 12 of the substrate 14, from the second insulating oxide layer 24 to the first insulating oxide layer 22. Large surfaces of the p-area 16 and the intermediate area 20 and of the intermediate area 20 and the n-area 18, respectively, abut immediately upon another, in particular in the vertical direction, from the second insulating oxide layer 24 to the first insulating oxide layer 22. Furthermore, large surfaces of the p-area 16 and of the first electrically conductive member 26 and the n-area 18 and the second electrically, respectively, conductive member 28 abut immediately upon another, i.e. in particular in the vertical direction, from the second insulating oxide layer 24 to the first insulating oxide layer 22, and form a large-surface contact or a large-surface electrical transition between the p-area 16 and the first electrically conductive member 26 and between the n-area 18 and the second electrically conductive member 28, respectively. On the end, which is adjacent to the second insulating oxide layer 24, and on the upper-edge of the first electrically conductive member 26 and of the second electrically conductive member 28, respectively, which is adjacent to the second insulating oxide layer 24, a first pad 30 and a second pad 32 are implemented, respectively. In the lateral direction, the p-area 16, the n-area 18, the intermediate area 20, the first electrically conductive member 26 and the second electrically conductive member 28 in each embodiment are together fully surrounded by a trench 34, with the trench, which extends in the vertical direction from the second insulating oxide layer 24 to the first insulating oxide layer 22, being filled with insulating material, e.g. with an oxide. The p-area 16, the n-area 18, the intermediate area 20, the first electrically conductive member 26 and the second electrically conductive member 28, apart from the pads 30, 32, are thus completely encapsulated by the first insulating oxide layer 22, the second insulating oxide layer 24 and the trench 34, which is filled with the insulating material, and, as against the environment, they are insulated against electricity.

The embodiments of the PIN diode 10 in accordance with the present invention, which have been described above and which are shown in FIGS. 1a to 9b, are essentially distinguished by the lateral arrangement of the individual members. In all embodiments, the p-area 16 (116), the n-area 18 (218), and the intermediate area 20 may consist of Si, GaAs or any other suitable semiconductor material, which, as a result of a suitable p-doping or n-doping, respectively, comprises a p-type conductivity or an n-type conductivity, respectively, in the p-area 16 (116) or in the n-area 18 (218), respectively.

In all embodiments shown above, the p-area 16, the n-area 18, and the electrically conductive members 26, 28 extend in the vertical direction from the second insulating oxide layer 24 to the first insulating oxide layer 22. As a deviation from the embodiments, the extensions of the same may also be smaller in the vertical direction, in particular, they may extend e.g. from the second insulating oxide layer 24 in the direction to the first insulating oxide layer 22, but may not extend entirely to the same. Especially, when the PIN diode 10 comprises a large extension in the lateral direction and a considerably shorter extension in the vertical direction, an incomplete extension of the p-area 16 (116) or of the n-area 18 (218), respectively, along the total vertical extension of the intermediate area 20 will have a small and maybe negligible impact on the electrical properties of the PIN diode 10.

All the embodiments shown above comprise electrically conductive members 26, 28, which extend in the vertical direction from the second insulating oxide layer 24 to the first insulating oxide layer 22 and which, due to their lateral expansion, form a large-surface electrical contact to the p-area 16 and to the n-area 18, respectively. In this arrangement, even if current flows through the PIN diode 10, which results in a voltage drop in the not ideally-conducting p-area 16 and n-area 18, the electrically conductive members 26, 28 serve to avoid a voltage drop in the vertical direction and in the horizontal direction, respectively, at right angles to the main current direction in the PIN diode 10 and to thus guarantee a homogeneous current distribution over the cross-section of the intermediate area 20.

Depending on the application, the respective requirements, and the selected geometry of the PIN diode 10, the first electrically conductive member 26 or the second electrically conductive member 28, respectively, may also comprise a smaller design or even be omitted. The electrically conductive members 26, 28 may comprise tungsten, metal silicide, or any other suitable material providing sufficient conductivity.

All embodiments of the PIN diode 10, which have been shown above, comprise a trench 34, which completely surrounds the individual members of the PIN diode 10 in the lateral direction, which extends in the vertical direction from the second insulating oxide layer to the first insulating oxide layer 22 and is filled with an insulating material. The trench 34 essentially serves to insulate the PIN diode 10 against laterally-adjacent devices or semiconductor structures on the first surface 12 of the substrate 14. Depending on the application of the PIN diode 10, depending on whether further devices or semiconductor structures are arranged on the substrate 14 and of which type these are, the trench 34 may be omitted or comprise a different design. It is e.g. possible not to fill the trench 34 with an insulating material, but to provide only its surface, which faces the members of the PIN diode 10, with an insulating oxide layer. Furthermore, e.g. in the lateral direction, the trench 34 may only be designed on those locations, where the other devices or semiconductor structures are adjacent to the PIN diode 10, and may be omitted on those locations, where the PIN diode 10 abuts on the edge of the substrate 14.

In all embodiments set forth above, the electrically conductive members 26, 28 comprise pads 30, 32 (130, 232) at their ends or edges, respectively, which are adjacent to the second insulating oxide layer 24, via which the PIN diode 10 or the p-area 16 (116) and the n-area 18 (218), respectively, may be contacted electrically and/or be connected to other devices. As indicated in FIGS. 1b, 4b, 5b, 6b, 7b, 8b, and 9b, the pads 30, 32, as regards their lateral expansion, may essentially follow the lateral expansion of the electrically conductive members 26, 28 or they may also comprise a lateral expansion deviating therefrom and being suitable for the respective application of the PIN diode 10. If the respective, corresponding, electrically conductive member 26, 28 (126, 228) has not been implemented, the pads 30, 32 (130, 232) may be directly arranged on the p-area 16 (116) and the n-area 18 (218), respectively, and be connected electrically to the same. Furthermore, a pad, e.g., may be dispensed with, if a p-area 16 (116) or an n-area 18 (218) are connected via the respective electrically conductive member 26, 28 (126, 228) or is directly connected to a further device and/or a further semiconductor structure on the surface 12 of the substrate 14. The pads 30, 32 (130, 232) may comprise any suitable material.

In all embodiments set forth above, the PIN diode 10 is enclosed in the vertical direction by the first insulating oxide layer 22 and the second insulating oxide layer 24. This high-quality feasible, passivating oxide interfaces comprise various advantages, in particular, a low re-combination rate. Depending on the application of the PIN diode 10, the requirements on the PIN diode 10 resulting therefrom, and depending on its geometry, the insulating oxide layers 22, 24 may be omitted in part or completely or may be replaced by other insulating layers.

An inventive method for manufacturing a lateral PIN diode preferably starts from the substrate 14 and a device substrate, which are connected to each other by wafer-bonding along the first surface 12 of the substrate 14. In the process, the first insulating oxide layer 22 is formed. On its surface, which faces away from the first surface 12 of the substrate 14, the device substrate is then thinned, as required, such that it comprises the thickness or the vertical dimension of the later intermediate area 20. In the device substrate, a p-area 16 is formed, in which a trench having the desired lateral and vertical expansion of the later p-area 16 is formed in the device substrate and which is filled with p-doped polysilicon. Furthermore, an n-area 18 is formed in the device substrate, in which a trench having the desired lateral vertical expansion of the later n-area 18 is formed in the device substrate and which is filled with n-doped polysilicon. The p-area 16 and the n-area 18 are formed while being spaced apart from one another. Between the p-area 16 and the n-area 18, an intermediate area 20 is formed in the device substrate, wherein a doping concentration of the intermediate area 20 is lower than a doping concentration of the p-area 16 and lower than a doping concentration of the n-area 18. Preferably, the device substrate comprises a semiconductor material, which forms the semiconductor material of the intermediate area 20. In a section of the device substrate, which abuts on the intermediate area 20, a trench 34 is formed, which extends from a surface of the device substrate, which faces away from the first surface 12 of the substrate 14, to the first insulating oxide layer and which, preferably, abuts directly on the intermediate area 20. The trench 34 is filled with an insulating material. The trench 34 is further formed in the sections of the device substrate, which abut on the p-area 16 and the n-area 18, such that it completely encloses the p-area 16, the n-area 18, and the intermediate area 20, and separates and insulates the same against laterally adjacent devices or semiconductor structures in the device substrate.

Furthermore, a first electrically conductive member 26 and a second electrically conductive member 28 are formed, which abut on one side of the p-area 16 or the n-area 18, which faces away from the intermediate area 20. The electrically conductive members 26, 28 each extend in the vertical direction from the surface of the device substrate, which faces away from the first surface 12 of the substrate 14, to the first insulating oxide layer 22 and in the lateral direction along the whole side of the p-area 16 and the n-area 18, respectively, which faces away from the intermediate area 20. The electrically conductive members 26, 28 thus form large-surface electrical contacts with the p-area 16 and the n-area 18, respectively. The electrically conductive members 26, 28 are formed in the described areas in the device substrate trenches having the desired expansion of the respective subsequent electrically conductive member 26, 28 and are filled with a sufficiently conductive material, for example, tungsten or metal silicide. On the surface of the electrically conductive members 26, 28, which faces away from the first surface 12 of the substrate 14, a first pad 30 and a second pad 32, respectively, are formed, which later serve for electrical connection of the PIN diode 10 and/or the p-area 16 and the n-area 18 to other electrical means or devices. Furthermore, above the surfaces of the p-area 16, the n-area 18, and the intermediate area 20, which face away from the first surface 12 of the substrate 14, a second insulating oxide layer is formed, which does not cover only the first pad 30 and the second pad 32.

As a deviation from the last embodiment, the p-area 16 and the n-area 18, respectively, may be formed in the device substrate by implanting p-material and n-material, respectively, into the desired predetermined area of the later p-area 16 and the n-area 18, respectively. However, the p-area 16 and the n-area 18, respectively, may be formed by forming a trench in the device substrate in a predetermined area, which abuts on the desired area of the subsequent p-area 16 or n-area 18, respectively, by introducing p-material or n-material, respectively, into the trench and diffusing the introduced material into the areas of the device substrate surrounding the trench.

Furthermore, as a deviation from the described embodiment of the inventive method for manufacturing a PIN diode, the first insulating oxide layer 22 or another suitable insulating layer being used in its place may be manufactured by another suitable method instead of wafer-bonding. For example, an insulating layer and then a layer from a lightly doped semiconductor material, which is suitable as material for the intermediate area of a PIN diode, may be grown onto a substrate. In this lightly doped semiconductor layer, a p-area and an n-area, which are spaced apart from one another, are formed, e.g. by the above-described processing steps. As a result, the intermediate area is formed automatically. In further processing steps, as has been described above, a trench, which completely surrounds the p-area, the n-area, and the intermediate area in the lateral direction, pads for the p-area and the n-area, electrically conductive members for the p-area and the n-area, and a further insulating layer on the surface of the intermediate area, the p-area and the n-area, which faces away from the substrate, may be formed.

According to the present invention, after the PIN diode 10 has been formed by one of the described methods, the substrate 14 may, if desired, be removed by etching, for example.

All inventive PIN diodes 10, which have been represented by means of FIGS. 1a to 9a, may be manufactured by the described methods.

Furthermore, a rear-side contact to the p-area 16 or the n-area 18, respectively, may be made by removing, before or during the manufacture of the p-area 16 or the n-area 18, respectively, an area of the first insulating oxide layer 22, which abuts on the p-area 16 or the n-area 18, respectively.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

We claim:

1. A method for manufacturing a PIN diode, comprising the following steps:
   forming a p-area extending from a first surface of a wafer;
   forming an n-area extending from the first surface of the wafer spaced apart from the p-area;
   forming an intermediate area extending from the first surface of the wafer between the p-area and the n-area, wherein a doping concentration of the intermediate area is lower than a doping concentration of the p-area and lower than a doping concentration of the n-area;
   forming a first electrically conductive member on a side of the p-area, which faces away from the intermediate area; and
   forming a second electrically conductive member on a side of the n-area, which faces away from the intermediate area.

2. The method in accordance with claim 1, comprising the following steps:
   providing the wafer and a device wafer; and
   wafer-bonding of the wafer and the device wafer, wherein the p-area, the n-area and the intermediate area are formed in the device wafer and insulated against the wafer.

3. The method in accordance with claim 2, comprising the following steps:
   forming a trench in a section of the device wafer, which abuts on the intermediate area, wherein the trench extends from a surface of the device wafer, which faces away from the wafer, to a surface of the device wafer, which is opposite to the wafer; and
   filling the trench with an insulating material.

4. The method in accordance with claim 3, wherein the trench is further formed in sections of the device wafer, which abut on the p-area and on the n-area.

5. The method in accordance with claim 2, wherein the p-area or the n-area, respectively, is formed by
   forming a trench in the device wafer and filling the same with p-doped or n-doped polysilicon, respectively, or by
   implanting of p-material or n-material, respectively, in predetermined areas of the device wafer, or by
   forming a trench in the device wafer, introducing of p-material or n-material, respectively, into the same and diffusing of the introduced material into the areas of the device wafer surrounding the trench.

6. The method in accordance with claim 1, further comprising the following step:
forming an insulating layer above the surface of the p-area, the n-area, and the intermediate area, which faces away from the first surface of the wafer.

7. The method in accordance with claim 1, further comprising the following step:
forming of pads on the surfaces of the p-area and the n-area, which face away from the first surface of the wafer.

8. A PIN diode comprising:
a p-area extending from a first surface of a wafer;
an n-area extending from the first surface of the wafer;
an intermediate area extending from the first surface of the wafer between the p-area and the n-area, wherein a doping concentration of the intermediate area is lower than a doping concentration of the p-area and lower than a doping concentration of the n-area;
a first electrically conductive member, which is arranged on a side of the p-area, which faces away from an intermediate area; and
a second electrically conductive member, which is arranged on a side of the n-area, which faces away from the intermediate area.

9. The PIN diode in accordance with claim 8, having an insulating layer on the wafer and a device wafer on the insulating layer, wherein the p-area, the n-area, and the intermediate area are arranged in the device wafer.

10. The PIN diode in accordance with claim 8, comprising:
a trench in a section of the device wafer, which abuts on the intermediate area, wherein the trench extends from a surface of the device wafer, which faces away from the wafer, to a surface of the device wafer, which is opposite to the wafer, and wherein the trench is filled with an insulating material.

11. The PIN diode in accordance with claim 10, wherein the trench is arranged in sections of the device wafer, which abut on the p-area and on the n-area.

12. The PIN diode in accordance with claim 11, wherein a shape of the intermediate area, which is determined by the trench, is essentially rectangular, wherein the p-area and the n-area are arranged on two opposite sides of the intermediate area.

13. The PIN diode in accordance with claim 12, wherein at least either the p-area or the n-area extend along a whole width of the intermediate area.

14. The PIN diode in accordance with claim 11, wherein a shape of the intermediate area, which is determined by the trench is essentially trapezoidal, wherein the p-area extends along one of the parallel sides of the intermediate area, and wherein the n-area extends along the other of the parallel sides of the intermediate area.

15. The PIN diode in accordance with claim 11, wherein a shape of the intermediate area, which is determined by the trench, is essentially circular, wherein either the p-area or the n-area is arranged in the shape of a circle along the edge of the intermediate area, wherein the n-area or the p-area, respectively, is essentially arranged in the center of the intermediate area and wherein the second electrically conductive member or the first electrically conductive member, respectively, is arranged in its center.

16. The PIN diode in accordance with claim 8, further composing:
a further insulating layer, which covers surfaces of the p-area, the n-area, and the intermediate area, which face away from the wafer.

17. The PIN diode in accordance with claim 8, wherein a first pad is conductively connected to the p-area and a second pad is conductively connected to the n-area, wherein the two pads are arranged at the surfaces of the p-area and the n-area, which face away from the first surface of the wafer.

18. The PIN diode in accordance with claim 8, wherein the distance between the p-area and the n-area is more than 30 $\mu$m.

19. The PIN diode in accordance with claim 8, further comprising first and second pads, said first pad is electrically connected to a surface of the p-area, said second pad is electrically connected to a surface of the n-area, wherein said surfaces face away from the first surface of the wafer.

* * * * *